| (12) | United States Patent | (10) Patent No.: | US 11,763,914 B2 |
|---|---|---|---|
| | Xu et al. | (45) Date of Patent: | *Sep. 19, 2023 |

(54) ADAPTING AN ERROR RECOVERY PROCESS IN A MEMORY SUB-SYSTEM

(71) Applicant: MICRON TECHNOLOGY, INC., Boise, ID (US)

(72) Inventors: Zhongguang Xu, San Jose, CA (US); Murong Lang, San Jose, CA (US); Zhenming Zhou, San Jose, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/557,782

(22) Filed: Dec. 21, 2021

(65) Prior Publication Data

US 2022/0115084 A1   Apr. 14, 2022

Related U.S. Application Data

(63) Continuation of application No. 16/989,374, filed on Aug. 10, 2020, now Pat. No. 11,244,740.

(51) Int. Cl.
| G11C 11/34 | (2006.01) |
| G11C 29/50 | (2006.01) |
| G11C 29/12 | (2006.01) |
| G11C 29/44 | (2006.01) |
| G11C 16/26 | (2006.01) |
| G11C 16/10 | (2006.01) |

(52) U.S. Cl.
CPC ........ *G11C 29/50004* (2013.01); *G11C 16/10* (2013.01); *G11C 16/26* (2013.01); *G11C 29/12005* (2013.01); *G11C 29/44* (2013.01)

(58) Field of Classification Search
CPC . G11C 16/10; G11C 11/5628; G11C 11/5642; G11C 16/0483; G11C 16/12
USPC .................................................. 365/185.24
See application file for complete search history.

(56) References Cited

U.S. PATENT DOCUMENTS

| 6,741,529 | B1 | 5/2004 | Getreuer | |
| 9,292,394 | B2 * | 3/2016 | Wu | ..................... G11C 11/5642 |
| 9,959,059 | B2 | 5/2018 | Orme et al. | |
| 11,244,740 | B1 * | 2/2022 | Xu | ......................... G11C 29/52 |
| 2020/0219571 | A1 | 7/2020 | Chen et al. | |

* cited by examiner

*Primary Examiner* — Son T Dinh
(74) *Attorney, Agent, or Firm* — Lowenstein Sandler LLP (57) ABSTRACT

A first sequence of operations corresponding to an error recovery process of a memory sub-system is determined. A value corresponding to an operating characteristic of a memory sub-system is determined, the operating characteristic corresponding to execution of a first sequence of operations of an error recovery process. A determination is made that the value satisfies a condition. In response to the value satisfying the first condition, a second sequence of operations corresponding to the error recovery process is executed.

20 Claims, 5 Drawing Sheets

ADAPTING AN ERROR RECOVERY PROCESS IN A MEMORY SUB-SYSTEM

CROSS-REFERENCE TO RELATED APPLICATION

This application is a continuation of U.S. patent application Ser. No. 16/989,374, filed on Aug. 10, 2020, the entirety of which is hereby incorporated by reference herein.

TECHNICAL FIELD

Embodiments of the disclosure relate generally to memory sub-systems, and more specifically, relate to adapting an error recovery process in a memory sub-system.

BACKGROUND

A memory sub-system can be a storage system, a memory module, or a hybrid of a storage device and memory module. The memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various implementations of the disclosure.

DETAILED DESCRIPTION

Aspects of the present disclosure are directed to managing execution of scrub operations in a memory sub-system. A memory sub-system can be a storage device, a memory module, or a hybrid of a storage device and memory module. Examples of storage devices and memory modules are described below in conjunction with FIG. 1. In general, a host system can utilize a memory sub-system that includes one or more memory devices. The host system can provide data to be stored at the memory sub-system and can request data to be retrieved from the memory sub-system.

The memory devices can be non-volatile memory devices, such as three-dimensional cross-point ("3D cross-point") memory devices that are a cross-point array of non-volatile memory that can perform bit storage based on a change of bulk resistance, in conjunction with a stackable cross-gridded data access array. Another example of a non-volatile memory device is a negative-and (NAND) memory device. Other examples of non-volatile memory devices are described below in conjunction with FIG. 1.

Each of the memory devices can include one or more arrays of memory cells. A memory cell ("cell") is an electronic circuit that stores information. Depending on the cell type, a cell can store one or more bits of binary information, and has various logic states that correlate to the number of bits being stored. The logic states can be represented by binary values, such as "0" and "1", or combinations of such values. For example, a single level cell (SLC) can store one bit of information and has two logic states. The various logic states have corresponding threshold voltage levels. A threshold voltage (VT) is the voltage applied to the cell circuitry (e.g., control gate at which a transistor becomes conductive) to set the state of the cell. A cell is set to one of its logic states based on the VT that is applied to the cell. For example, if a high VT is applied to an SLC, a charge will be present in the cell, setting the SLC to store a logic 0. If a low VT is applied to the SLC, charge will be absent in the cell, setting the SLC to store a logic 1.

For certain memory types (i.e., for memory sub-systems employing certain types of storage media), error rates can vary over time. In particular, some non-volatile memories have threshold voltage programming distributions that move or "drift" higher over time. At a given read voltage level (i.e., a value of the voltage applied to a memory cell as part of a read operation), if the threshold voltage programming distributions move, then certain reliability statistics can also be affected. One example of a reliability statistic is a bit error rate (BER). The BER can be defined as the ratio of the number of erroneous bits to the number of all data bits stored in a unit of the memory sub-system, where the unit can be the entire memory sub-system, a die of memory device, a collection of codewords, or any other meaningful portion of the memory sub-system.

A read operation can be performed with a read voltage level. The read threshold voltage level or value (herein the "read voltage level") can be a particular voltage that is applied to memory cells of a memory device to read the data stored at the memory cells. For example, if a threshold voltage of a particular memory cell is identified as being below the read voltage level that is applied to the particular memory cell, then the data stored at the particular memory cell can be a particular value (e.g., '1') and if the threshold voltage of the particular memory cell is identified as being above the read voltage level, then the data stored at the particular memory cell can be another value (e.g., '0'). Thus, the read voltage level can be applied to memory cells to determine values stored at the memory cells.

In a conventional memory sub-system, when the threshold voltage programming distributions of a memory cell change, the application of the read voltage level can be inaccurate relative to the changed threshold voltage. For example, a memory cell can be programmed to have a threshold voltage below the read voltage level. The programmed threshold voltage can change over time and can shift to be above the read voltage level. For example, the threshold voltage of the memory cell can shift from initially being below the read voltage level to being above the read voltage level. As a result, when the read voltage level is applied to the memory cell, the data stored at the memory cell can be misread or misinterpreted to be at a wrong value as compared to the value as originally stored when the threshold voltage had not yet shifted.

The speed or rate of the drift of the threshold voltage programming distributions and corresponding BER of a conventional memory sub-system can be affected by one or more operating characteristics of the memory sub-system, such as cycling conditions, changes in die temperature and read disturb conditions. For example, a set (e.g., establishing a "1" value) and reset (e.g., establishing a "0" value) cycling in a 3D cross-point system can degrade the memory cells having wider threshold voltage distributions. The set distribution can have a first leading edge (E1) and a second trailing edge (E2). Further, the reset distribution can have a first leading edge (E3) and a second trailing edge (E4). Cycling conditions can cause longer edge tails between adjacent programming distributions (e.g., the E2 and E3 tails). Longer edge tails, particularly the E2 and E3 tails, can be caused by severe thermal disturb, read disturb, or both. In addition, temperature conditions and delays between cycles can cause degradation variation from memory device to memory device. For example, higher temperatures and longer delays between cycles can lead to greater threshold voltage drift and degradation.

The threshold voltage drift and degradation cause errors during the performance of a memory access operation (e.g., a read operation, a write operation, etc.) at a memory device. For example, while performing a read operation, a memory sub-system controller can misread bits representing data stored at the memory device (i.e., the stored value is read incorrectly). In another example, one or more bits representing data stored at the memory device can contain errors (i.e., the value is stored incorrectly). Either situation can result in an error during performance of a read operation (e.g., a memory access operation error). Upon detecting that a memory access operation error has occurred, the memory sub-system controller can perform an error correction operation to correct the errors in the data and perform the memory access operation again to access the corrected data. In some instances, an error correction operation can be a memory scrubbing operation, where the memory sub-system controller corrects an error in the data and writes the corrected data back to the memory device.

To address errors due to threshold voltage drift, conventional memory sub-systems typically employ a predefined error recovery process including a preset sequence of read retry operations at different read retry voltage levels (e.g., a sensing voltage level) to enable error correction and data recovery. The error recovery process can include the execution of a sequence of multiple read retry operations to re-read data as part of an error correction process. In an embodiment, the error recovery process can include the use of multiple different read retry threshold voltages including a base value (e.g., read retry threshold voltage 1 ($V_{r1}$)), a second value offset from the base value (e.g., read retry threshold voltage 2 ($V_{r2}$)), and a third value offset from the base value (e.g., read retry threshold voltage 3 ($V_{r3}$)). The three read retry threshold voltages are intended to cover the voltage drift range over different periods of time. For example, read retry operation 1 (i.e., execution of a read retry operation at $V_{r1}$ is employed during a first time period of the error recovery process (e.g., a time range of 1 microsecond to a few seconds), read retry operation 2 (i.e., execution of the read retry operation at $V_{r2}$ is employed during a second time period (e.g., a time range of a few seconds to a few hours), and read retry operation 3 (i.e., execution of a read retry operation at $V_{r3}$) is employed during a third time period exceeding a few hours to cover longer voltage drifts.

However, executing a fixed sequence of read retry operations can result in the application of a read retry threshold voltage that causes read corruption. For example, applying a higher-than-optimal read retry threshold voltage to one or more memory cells of a memory device can result in a reset cell that is incorrectly read as a set cell is further pushed lower to the set cell region. This results in a further mixing of reset and set threshold voltage distributions and data corruption.

Accordingly, 3D cross-point systems employ a same read retry flow or static sequence of read retry operations during a life of the memory device, independent of changes to the operating parameters of the memory device (e.g., cycling conditions, temperature, read disturb conditions, etc.). In this regard, conventional systems apply the same sequence (e.g., a sequence of read retry operation 1-read retry operation 1-read retry operation 2-read retry operation 2-read retry operation 3) irrespective of the conditions of the memory drive or drive-to-drive variations.

Aspects of the present disclosure address the above and other deficiencies by having a memory sub-system that manages the execution of an error recovery process having an adaptive sequence of read retry operations based on one or more operating characteristics of a memory sub-system. In particular, the flow or sequence of read retry operations of the error recovery process can be adjusted based on one or more operating characteristics of the memory sub-system, such as a measurement or value associated with a read retry rate or a cycling condition (e.g., a number or count of set/reset cycles performed by the memory device).

Advantages of the present disclosure include, but are not limited to, dynamically setting a selected sequence of operations (e.g., a selected number of read retry operations and a selected order of operations) of an error recovery process flow based on operating characteristics or conditions of a memory sub-system. Beneficially, adjustment of the sequence of read retry operations reduces system degradation due to read retry operations that are at a higher level than optimal (e.g., performing a read retry operation 3 when a read retry operation 2 is sufficient) and excessive errors due to read retry operations that are at a lower level than optimal (e.g., performing a read retry operation 1 when a read retry operation 2 is appropriate). Advantageously, the adjustment to the sequence of read retry operations addresses drive reliability degradation associated with a life cycle of the memory drive. A sequence can be applied that has a desired number of read retry operations and sequence of those read retry operations for a memory drive in a beginning-of-life (BOL) cycle when fewer read retry operations are needed. In addition, the number and sequence of read retry operations can be updated or adjusted for a memory drive in an end-of-life (EOL) cycle when a greater number of read retry operations are needed. Accordingly, the error recovery process flow or sequence is adjustable to address drive-to-drive variation and reduce read corruption (e.g., due to read noise and edge tail disturb).

Figure 1:
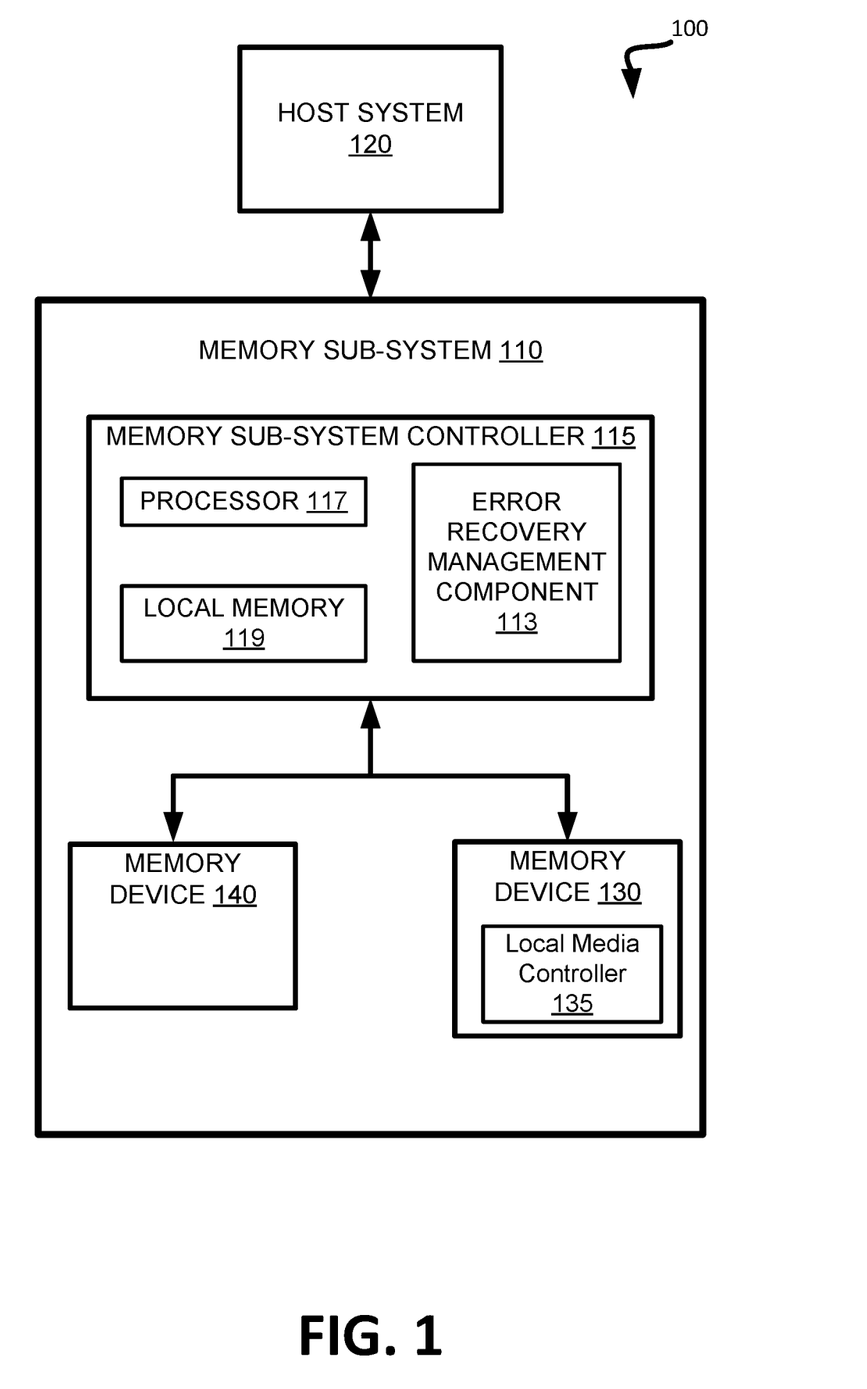
FIG. 1 illustrates an example computing system that includes a memory sub-system in accordance with some embodiments of the present disclosure.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, and a hard disk drive (HDD). Examples of memory modules include a dual in-line memory module (DIMM), a small outline DIMM (SO-DIMM), and a non-volatile dual in-line memory module (NVDIMM).

The computing environment 100 can include a host system 120 that is coupled to one or more memory sub-systems 110. In some embodiments, the host system 120 is coupled to different types of memory sub-system 110. FIG. 1 illustrates one example of a host system 120 coupled to one memory sub-system 110. The host system 120 uses the memory sub-system 110, for example, to write data to the memory sub-system 110 and read data from the memory sub-system 110. As used herein, "coupled to" generally refers to a connection between components, which can be an indirect communicative connection or direct communicative connection (e.g., without intervening components), whether wired or wireless, including connections such as electrical, optical, magnetic, etc.

The host system 120 can be a computing device such as a desktop computer, laptop computer, network server, mobile device, a vehicle (e.g., airplane, drone, train, automobile, or other conveyance), Internet of Things (IoT) devices, embedded computer (e.g., one included in a vehicle, industrial equipment, or a networked commercial device), or such computing device that includes a memory and a processing device. The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), etc. The physical host interface can be used to transmit data between the host system 120 and the memory sub-system 110. The host system 120 can further utilize an NVM Express (NVMe) interface to access the memory components (e.g., memory devices 130) when the memory sub-system 110 is coupled with the host system 120 by the PCIe interface. The physical host interface can provide an interface for passing control, address, data, and other signals between the memory sub-system 110 and the host system 120.

The memory devices can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased.

Although non-volatile memory components such as 3D cross-point type memory are described, the memory device 130 can be based on any other type of non-volatile memory, such as negative-and (NAND), read-only memory (ROM), phase change memory (PCM), self-selecting memory, other chalcogenide based memories, ferroelectric random access memory (FeRAM), magneto random access memory (MRAM), negative-or (NOR) flash memory, and electrically erasable programmable read-only memory (EEPROM).

One type of memory cell, for example, single level cells (SLC) can store one bit per cell. Other types of memory cells, such as multi-level cells (MLCs), triple level cells (TLCs), and quad-level cells (QLCs), can store multiple bits per cell. In some embodiments, each of the memory devices 130 can include one or more arrays of memory cells such as SLCs, MLCs, TLCs, QLCs, or any combination of such. In some embodiments, a particular memory component can include an SLC portion, and an MLC portion, a TLC portion, or a QLC portion of memory cells. The memory cells of the memory devices 130 can be grouped as pages or codewords that can refer to a logical unit of the memory device used to store data. With some types of memory (e.g., NAND), pages can be grouped to form blocks. Some types of memory, such as 3D cross-point, can group pages across dice and channels to form management units (MUs).

The memory sub-system controller 115 can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can include a processor (processing device) 117 configured to execute instructions stored in local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the memory sub-system controller 115, in another embodiment of the present disclosure, a memory sub-system 110 may not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical block address and a physical block address that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory sub-system 110 includes an error recovery management component 113 that can be used to adjust an error recovery process flow including a number and sequence of read retry operations based on one or more operating characteristics of the memory sub-system 110. In an embodiment, a read retry operation is executed to re-read data as part of an error correction process. In an embodiment, the read retry operation is performed using a threshold voltage level of a set of threshold voltage level (e.g., read retry threshold voltage 1 ($V_{r1}$), read retry threshold voltage 2 ($V_{r2}$), read retry threshold voltage 3 ($V_{r3}$)). In an embodiment, the error recovery management component 113 maintains a counter to determine a number of times each respective read retry operation (e.g., read retry operation 1 using $V_{r1}$, read retry operation 2 using $V_{r2}$, and read retry operation 3 using $V_{r3}$) is applied as part of the error recovery process.

In an embodiment, a read retry rate can be determined for each of the multiple read retry threshold voltages (e.g., $V_{r1}$, $V_{r2}$, $V_{r3}$, etc.). In an embodiment, the error recovery management component 113 identifies a read retry rate as the operating characteristic of the memory sub-system to be monitored and used for comparison purposes. In an embodiment, the read retry threshold voltage can be preset to one of a $V_{r1}$, $V_{r2}$, or $V_{r3}$ associated with a read retry error correction process. In an embodiment, the error recovery management component 113 uses a value of the second read retry threshold voltage ($V_{r2}$) of the error correction process as the selected read retry threshold voltage (i.e., the operating characteristic) for use in determining changes, updates, or adjustments to the sequence of operations of the error recovery process flow, as described in greater detail below.

In an embodiment, the error recovery management component 113 compares the selected read retry rate (e.g., the operating characteristic) to a threshold range of values to determine if a condition is satisfied. In an embodiment, the condition is satisfied if the measured read retry rate is within the threshold range of values (e.g., between a minimum read retry level and a maximum read retry level associated with the threshold range).

Figure 4:
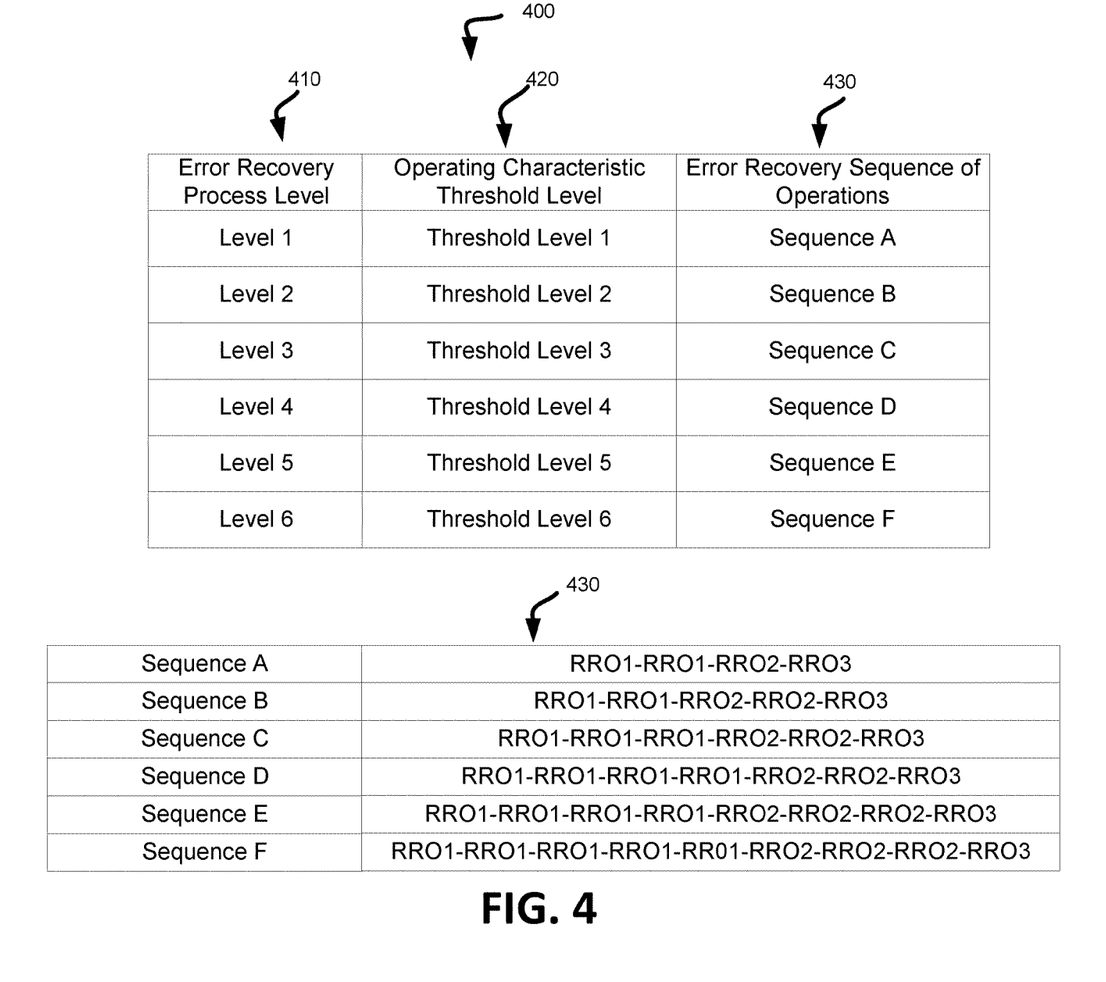
FIG. 4 illustrates a table including example error recovery process levels including corresponding operating characteristic threshold levels and sequences of operations of an error recovery process in accordance with some embodiments.

In an embodiment, the error recovery management component 113 maintains a data structure (e.g., a look-up table) including multiple steps or levels of the error recovery process, as shown in an example in FIG. 4. Each of the error recovery process levels is associated with an operating characteristic threshold range and an error recovery sequence of operations. In an embodiment, the error recovery management component 113 can perform a look-up operation using the data structure to identify which threshold range the measured operating characteristic within and set or apply the sequence of read retry operations corresponding to the identified error recovery process level, as described in greater detail with regard to FIG. 2.

In an embodiment, the operating characteristic identified by the error recovery management component 113 is a cycling condition (e.g., a set/reset cycle count of the memory device 130, 140). In an embodiment, the error recovery management component 113 determines if a current cycle count is within a cycle count range corresponding to an error recovery process level. Upon determining the threshold range that the current cycle count is within, the error recovery management component 113 applies the error recovery sequence of operations corresponding to the identified error recovery process level, as described in greater detail with respect to FIG. 3. This enables the error recovery sequence of operations (e.g., a number of read retry operations and a sequence of those operations at the various read retry threshold voltage levels) to be adjusted throughout the lifecycle of the memory device 130, 140 to account for device and temperature variations.

Figure 2:
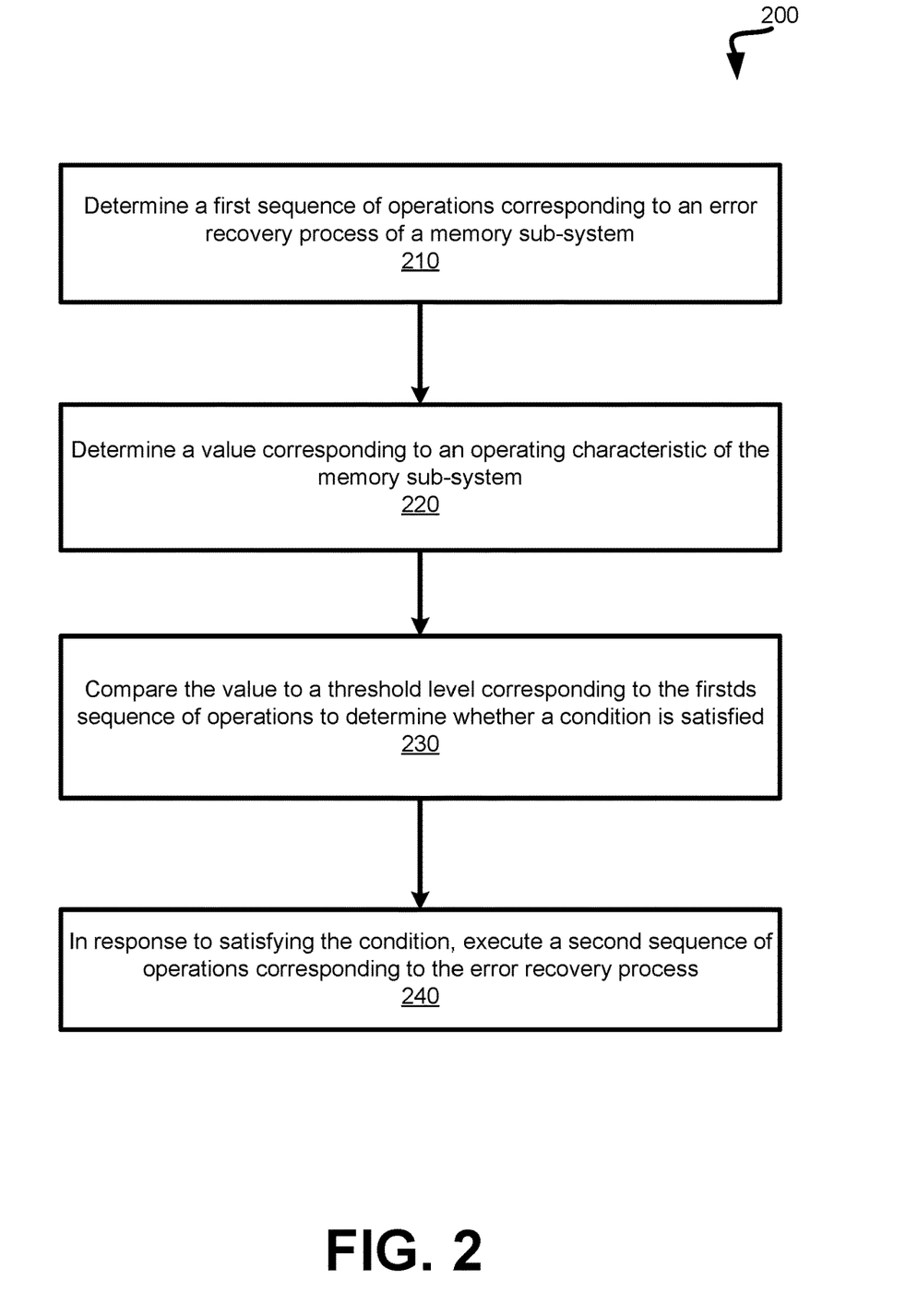
FIG. 2 is a flow diagram of an example method to identify and execute a sequence of operations of an error recovery process based on an operating characteristic of a memory sub-system in accordance with some embodiments.

FIG. 2 is a process flow diagram of an example method 200 to manage the execution of an error recovery process including a sequence of operations identified based on an operating characteristic of a memory sub-system in accordance with some embodiments. The method 200 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 200 is performed by the error recovery management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 2, in operation 210, the processing logic (e.g., the error recovery management component 113 of FIG. 1) determines a first sequence of operations corresponding to an error recovery process of a memory sub-system. In an embodiment, the first sequence of operations identified by the processing logic represents a current sequence of read retry operations that are being applied as part of the error recovery process in response to detection of one or more errors in the memory sub-system. For example, when one or more errors are detected and an error recovery process is initiated, the processing logic executes the first sequence of operations. In an embodiment, the first sequence of operations can be a default or initial sequence of operations of the error recovery process. In an embodiment, as shown in FIG. 4, the first sequence that is determined by the processing logic can be one of a set of multiple error recovery sequences of operations 430 as maintained in a data structure 400. As shown in FIG. 4, each of the error recovery sequences 430 (e.g., Sequence A, Sequence B, Sequence C . . . and Sequence F) corresponds to a respective error recovery process level 410 (e.g., Level 1, Level 2, Level 3 . . . and Level 6) associated with a respective operating characteristic threshold level 420. The first sequence of operations of an error recovery process being applied in the memory sub-system can be any of the example sequences shown in FIG. 4 (e.g., Sequence A, Sequence B, Sequence C . . . or Sequence F). In an example, the first sequence can be Sequence A of FIG. 4, which includes the following sequence of read retry operations: RRO1-RRO1-RRO2-RRO3.

In operation 220, the processing logic determines a value corresponding to an operating characteristic of the memory sub-system. In an embodiment, the operating characteristic can include a selected read retry rate corresponding to one of a set of read retry operations executed at different read threshold voltage levels to re-read a memory cell as part of the error recovery process. In an embodiment, the read retry operations can include read retry operation (RRO) 1 executed using a first threshold voltage ($V_{t1}$), RRO 2 executed using a second threshold voltage ($V_{t2}$), and RRO 3 executed using a third threshold voltage ($V_{t3}$). In an embodiment, Vt1 is a first or base threshold voltage value, Vt2 is a second value that is offset from Vt1 by an offset value (e.g., 300 mV), and Vt3 is a third value that is offset from Vt1 by a further offset value (e.g., 500 mV).

In an embodiment, the operating characteristic is a read retry rate associated with the second threshold voltage ($V_{t2}$). In an embodiment, the value of the operating characteristic is determined by checking a counter configured to track the selected read retry rate. In an embodiment, the counter tracks a number of read retry operations executed at the multiple different threshold voltages to monitor a total read retry operation count (e.g., a count associated with RRO 1, RRO 2, and RRO 3. In an embodiment, the selected read retry rate can be the read retry rate associated with a second read retry threshold voltage ($V_{t2}$) of the set of read retry threshold voltage (e.g., a set including a first read retry threshold voltage ($V_{t1}$), the second read retry threshold voltage ($V_{t2}$) and a third read retry threshold voltage ($V_{t3}$)). In an embodiment, the value corresponding to the second read retry rate (e.g., the selected operating characteristic) can be represented by the following equation:

$$V_{t2} \text{ Read Retry Rate} = V_{t2} \text{ read retry count}/(V_{t1} \text{ read retry count} + V_{t2} \text{ read retry count} + V_{t3} \text{ read retry count}).$$

In operation 230, the processing logic compares the value to a threshold level corresponding to the first sequence of operations to determine whether a condition is satisfied. In an embodiment, the processing logic can compare the measured value (e.g., the measured or current rate of RRO 2) to a threshold level corresponding to a current error recovery level (e.g., a level corresponding to the first sequence of operations determined in operation 210). For example, with reference to FIG. 4, if in operation 210 the processing logic determines the first sequence of operations is Sequence A (e.g., the current error recovery level is Level 1), the processing logic performs a look-up operation using a data structure to compare the value of the operating characteristic to threshold level 1. In an embodiment, the data structure 400 of FIG. 4 includes a threshold level corresponding to each of the error recovery process levels. For example, threshold level 1 can be a read retry rate value of $1\times10^{-6}$, threshold level 6 can be a read retry rate value of $1\times10^{-4}$, and threshold levels 2 through 5 can be read retry rate values set at increasing increments between $1\times10^{-6}$ and $1\times10^{-4}$.

In operation 240, in response to satisfying the condition, the processing device executes a second sequence of operations corresponding to the error recovery process. In an embodiment, the second sequence of operations can be a sequence that corresponds to a next error recovery process level (e.g., an error recovery level that follows a previous error recovery process level in the data structure 400 of FIG. 4). Continuing the example above, since the measured or current operating characteristic value exceeded Threshold Level 1 of error recovery process level 1 the processing logic determines Level 2 is the next level and the new sequence of operations is identified as Sequence B. In this example, Sequence B includes the following sequence of operations: RRO1-RRO1-RRO2-RRO2-RRO3. As shown, Sequence B includes an additional RRO2 operation in the sequence, as compared to Sequence A.

Advantageously, operations 210-240 can be performed by the processing logic iteratively over the lifecycle of a memory device to dynamically manage and adjust the sequence of operations of the error recovery process flow in view of changing operating characteristics (e.g., a read retry rate at a selected read threshold voltage level) caused by memory device variations and temperature variations.

Figure 3:
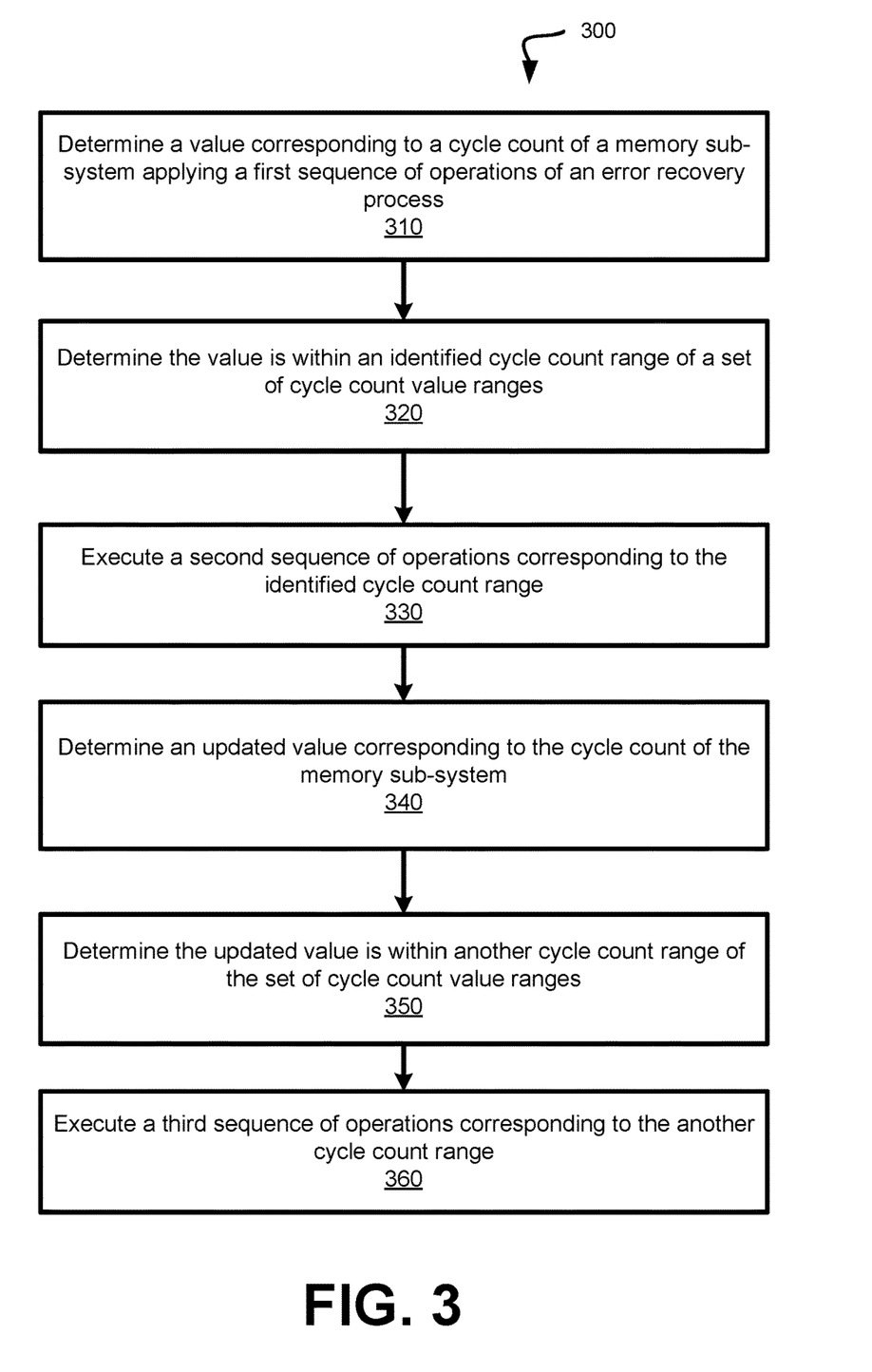
FIG. 3 is a flow diagram of an example method to identify and execute a sequence of operations of an error recovery process based on a cycle count of a memory sub-system in accordance with some embodiments.

FIG. 3 is a process flow diagram of an example method 300 to manage and adjust a sequence of operations of an error recovery process flow implemented by a memory sub-system in accordance with some embodiments. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the error recovery management component 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

As shown in FIG. 3, in operation 310, the processing logic determines a value corresponding to a cycle count of a memory sub-system applying a first sequence of operations of an error recovery process. In an embodiment, the cycle count represents a number of set/reset cycles performed during a lifecycle of the memory sub-system. In an example, the first sequence of operations can include Sequence C of the set of sequences shown in FIG. 4 (e.g., Sequence A through Sequence F). In an embodiment, the processing logic and perform operation 310 on a periodic basis (e.g., every 1K cycles) to determine the current value of the cycle count.

In operation 320, the processing logic determines the value is within an identified cycle count range of a set of cycle count ranges. In an embodiment, the processing logic maintains a data structure (e.g., similar to the one shown in FIG. 4) which includes multiple error recovery process levels (e.g., Level 1 through Level 6). Each of the error recovery process levels is associated with a range of cycle count values (e.g., range 1 through range 6). In an example, range 1 associated with Level 1 can have a range of values of 0 to 20K cycles, range 2 associated with Level 2 can have a range of values of greater than 20K to 50K cycles, range 3 associated with Level 3 can have a range of values of greater than 50K to 120K cycles, range 4 associated with Level 4 can have a range of values of greater than 120K to 140K cycles, range 5 associated with Level 5 can have a range of values of greater than 140K to 150K cycles, and range 6 associated with Level 6 can have a range of values of greater than 150K to 160K cycles. Furthermore, each of the error recovery process levels is associated with a different sequence of operations. For example, Level 1 is associated with Sequence A, Level 2 is associated with Sequence B, Level 3 is associated with Sequence C, Level 4 is associated with Sequence D, Level 5 is associated with Sequence E, and Level 6 is associated with Sequence F. In an embodiment, the processing logic performs a look-up operation using the data structure to compare the value to the identified cycle count range.

In operation 330, the processing logic executes a second sequence of operations corresponding to the identified cycle count range. For example, if in operation 320 the determined or value of cycle counts is within range 2 (e.g., between greater than 20K and 50K cycles in the example above), then the processing logic identifies a sequence associated with range 2. For example, the identified sequence could be Sequence D as shown in FIG. 4, which includes the following sequence of operations: RRO1-RRO1-RRO1-RRO1-RRO2-RRO2-RRO3.

In operation 340, the processing logic determines an updated value corresponding to the cycle count of the memory sub-system. In an embodiment, while the second sequence of operations of the error recovery process is active and applicable as a result of operation 340, the processing logic can again check the counter associated with the cycle count to determine the updated value of the cycle count (e.g., the current cycle count).

In operation 350, the processing logic determines the updated value is within another cycle range of the set of cycle count value ranges. Continuing the example above, the processing logic can determine the updated value of the cycle count is now within range 3 (e.g., between greater than 50K and 120K cycles in the example above) and identifies a sequence of read retry operations associated with range 3. For example, the processing logic can determine that an adjustment or change to the sequence is to be made from the previous sequence (e.g., Sequence D in the example above) to an adjusted or updated sequence (e.g., Sequence E of FIG. 4).

In operation 360, the processing logic executes a third sequence of operations corresponding to the another cycle count range. In the example above, since the updated value of the cycle count is within range 3 (e.g., Level 3 of the error recovery process), the processing logic executes a corresponding sequence (e.g., Sequence E of FIG. 4) which includes RRO1-RRO1-RRO1-RRO1-RRO2-RRO2-RRO2-RRO3. As shown in FIG. 3, the process logic can dynamically adapt a sequence of operations (e.g., from the first sequence to the second sequence to the third sequence and so on) of the error recovery process flow in view of the changing cycle count. Advantageously, the sequence of operations of the error recovery process flow can be adapted in view of a lifecycle stage of the memory sub-system to reduce drive reliability degradation. In an embodiment, the first sequence of operations of operation 310 (e.g., Sequence C including operations RRO1-RRO1-RRO1-RRO2-RRO2-RRO3) can have fewer operations than the second sequence of operations of operation 330 (e.g., Sequence D including operations RRO1-RRO1-RRO1-RRO1-RRO2-RRO2-RRO3) which in turn has fewer operations than the third sequence of operations of operation 360 (e.g., Sequence E including operations RRO1-RRO1-RRO1-RRO1-RRO2-RRO2-RRO2-RRO3). This enables the execution of an increasing number of read retry operations as the memory sub-system proceeds through the stages of its lifecycle (e.g., transitions from a beginning-of-life stage requiring fewer read retry operations to an end-of-life stage requiring more read retry operations.

Figure 5:
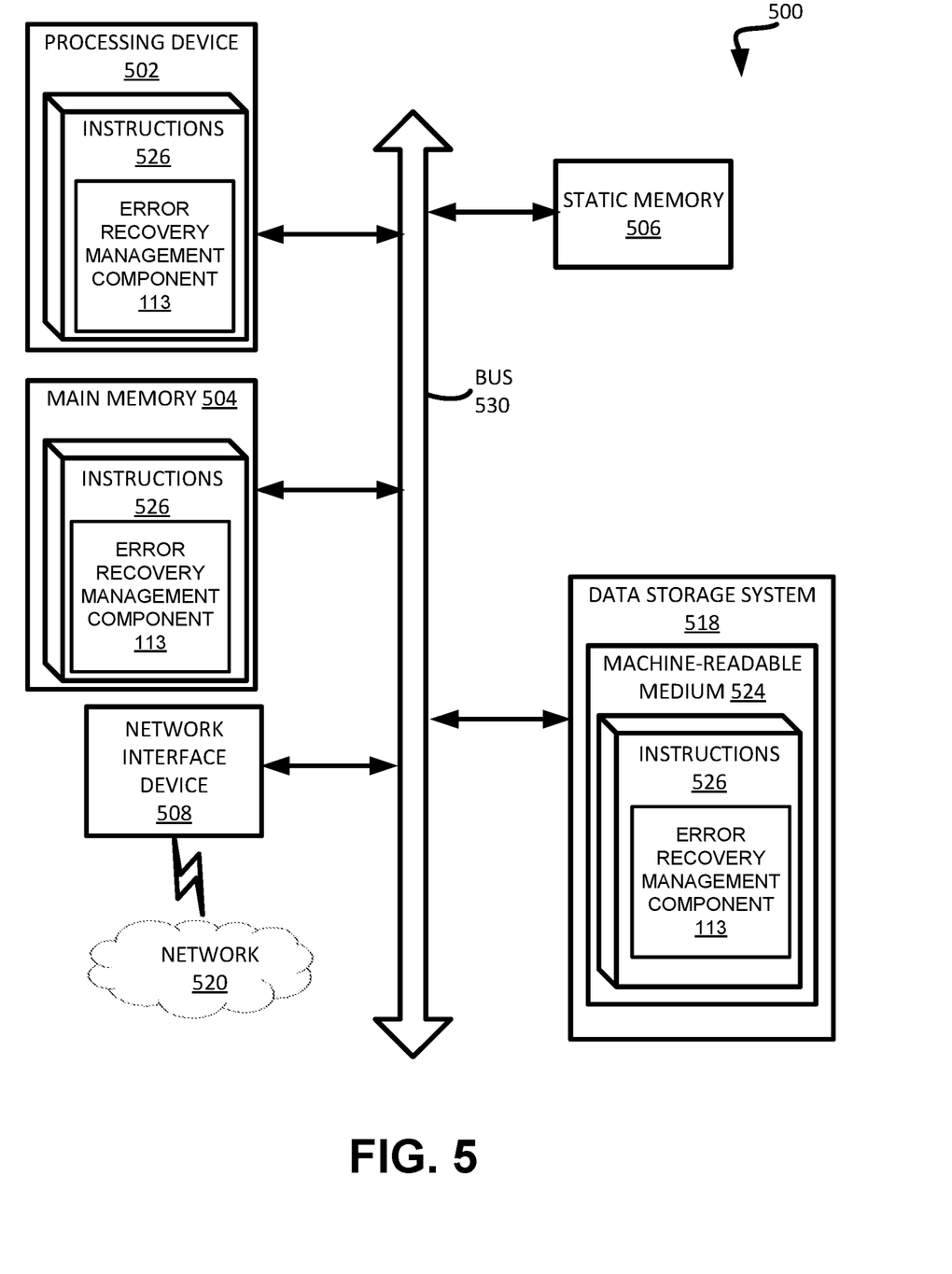
FIG. 5 is a block diagram of an example computer system in which implementations of the present disclosure can operate.

FIG. 5 illustrates an example machine of a computer system 500 within which a set of instructions, for causing the machine to perform any one or more of the methodologies discussed herein, can be executed. In some embodiments, the computer system 500 can correspond to a host system (e.g., the host system 120 of FIG. 1) that includes, is coupled to, or utilizes a memory sub-system (e.g., the memory sub-system 110 of FIG. 1) or can be used to perform the operations of a controller (e.g., to execute an operating system to perform operations corresponding to an error recovery management component 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, digital or non-digital circuitry, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory sub-system 110 of FIG. 1.

In one embodiment, the instructions 526 include instructions to implement functionality corresponding to a read voltage adjustment component (e.g., the error recovery management component 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   determining a value corresponding to an operating characteristic of a memory sub-system, the operating characteristic corresponding to execution of a first sequence of operations of an error recovery process;
   determining the value satisfies a condition; and
   in response to the value satisfying the condition, executing a second sequence of operations corresponding to the error recovery process.

2. The method of claim 1, wherein the operating characteristic comprises a read retry rate associated with a read retry threshold voltage level.

3. The method of claim 2, wherein the read retry threshold voltage level is selected from a set of read retry threshold voltage levels comprising a first read retry threshold voltage level, a second read retry threshold voltage level, and a third read retry threshold voltage level.

4. The method of claim 1, wherein the operating characteristic comprises a read retry rate determined based on a first count of read retry operations associated with a first read retry threshold voltage level compared to a sum of counts of read retry operations associated with a plurality of read retry threshold voltage levels.

5. The method of claim 1, wherein the condition is satisfied upon determining the value is greater than or equal to a threshold level.

6. The method of claim 1, wherein the first sequence of operations comprises one or more read retry operations executed using one of a plurality of read threshold voltage levels.

7. The method of claim 1, further comprising:
determining a further value corresponding to the operating characteristic of the memory sub-system; and
in response to determining the further value is greater than a threshold level, executing a third sequence of operations corresponding to the error recovery process.

8. A non-transitory computer readable medium comprising instructions, which when executed by a processing device, cause the processing device to perform operations comprising:
determining a cycle count of a memory sub-system corresponding to application of a first sequence of operations of an error recovery process;
determining the cycle count is within a cycle count range of a set of cycle count ranges; and
executing a second sequence of operations corresponding to the cycle count range.

9. The non-transitory computer readable medium of claim 8, wherein the second sequence of operations comprises a greater number of read retry operations than the first sequence of operations.

10. The non-transitory computer readable medium of claim 8, the operations further comprising:
determining an updated cycle count of the memory sub-system; and
determining the updated cycle count is within an another cycle count range of the set of cycle count ranges.

11. The non-transitory computer readable medium of claim 10, the operations further comprising:
executing a third sequence of operations corresponding to the another cycle count range.

12. The non-transitory computer readable medium of claim 11, wherein the third sequence of operations comprises a greater number of read retry operations than the second sequence of operations.

13. The non-transitory computer readable medium of claim 8, the operations further comprising:
maintaining a data structure comprising a plurality of error recovery process levels, wherein each error recovery process level comprises a cycle count range and a sequence of operations.

14. The non-transitory computer readable medium of claim 13, the operations further comprising
performing a look-up operation of the data structure to identify the second sequence of operations corresponding to the cycle count range.

15. A system comprising:
a memory component; and
a processing device, operatively coupled with the memory component, to perform operations comprising:
determining a value corresponding to an operating characteristic of a memory sub-system, the operating characteristic corresponding to execution of a first sequence of operations of an error recovery process;
determining the value satisfies a condition; and
in response to the value satisfying the condition, executing a second sequence of operations corresponding to the error recovery process.

16. The system of claim 15, wherein the operating characteristic comprises a read retry rate associated with a read retry threshold voltage level.

17. The system of claim 16, wherein the read retry threshold voltage level is selected from a set of read retry threshold voltage levels comprising a first read retry threshold voltage level, a second read retry threshold voltage level, and a third read retry threshold voltage level.

18. The system of claim 16, wherein the operating characteristic comprises a read retry rate determined based on a first count of read retry operations associated with a first read retry threshold voltage level compared to a sum of counts of read retry operations associated with a plurality of read retry threshold voltage levels.

19. The system of claim 15, wherein the condition is satisfied upon determining the value is greater than or equal to a threshold level.

20. The system of claim 15, wherein the first sequence of operations comprises one or more read retry operations executed using one of a plurality of read threshold voltage levels.

* * * * *